(12) United States Patent
Ghosh

(10) Patent No.: US 7,121,912 B2
(45) Date of Patent: Oct. 17, 2006

(54) METHOD OF IMPROVING STABILITY IN OLED DEVICES

(75) Inventor: Amalkumar P. Ghosh, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 363 days.

(21) Appl. No.: 10/764,765

(22) Filed: Jan. 26, 2004

(65) Prior Publication Data

US 2005/0164589 A1 Jul. 28, 2005

(51) Int. Cl.
*H01J 9/00* (2006.01)
(52) U.S. Cl. ..................................................... 445/23
(58) Field of Classification Search ............. 445/23–25
See application file for complete search history.

(56) References Cited

U.S. PATENT DOCUMENTS

| 4,769,292 A | 9/1988 | Tang et al. |
| 4,885,211 A | 12/1989 | Tang et al. |
| 6,104,137 A | 8/2000 | Abiko et al. |

*Primary Examiner*—Joseph Williams
(74) *Attorney, Agent, or Firm*—Raynond L. Owens

(57) ABSTRACT

A method of treating a cathode of an OLED device having a substrate and which has a spaced anode and organic layers between the anode and cathode includes evacuating a chamber so that it has a pressure no greater than $10^{-6}$ Torr; heating the OLED substrate in the chamber to a temperature less than 100° C.; and delivering gas, including ozone, to the evacuated chamber which includes the heated OLED substrate at a sufficient rate so that the pressure is less than 1 atmosphere, so that the life of the OLED substrate is increased and the operating voltage is decreased.

5 Claims, 4 Drawing Sheets

METHOD OF IMPROVING STABILITY IN OLED DEVICES

FIELD OF THE INVENTION

The present invention relates to the manufacture of OLED devices with improved stability.

BACKGROUND OF THE INVENTION

An organic light-emitting diode device, also called an OLED device, commonly includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211. OLED devices are generally anticipated to overtake liquid crystal displays (LCDs) as the preferred display technology.

Degradation of the output intensity occurs over time, which can lead to hue shifts or loss of contrast. Many approaches have been attempted to improve the operational stability of OLEDs. In U.S. Pat. No. 6,104,137, Abiko et al. enclosed an oxidizing gas within an airtight case. However, enclosing a gas within an airtight case adds to the complexity of manufacturing an OLED device. Moreover, long term effects of oxygen diffusing into the OLED device can be detrimental to the operating life of the device. There is therefore a need to develop a method to improve the stability of OLED devices using stabilizing dopants without causing a deterioration of the color.

SUMMARY OF THE INVENTION

It is therefore an object of the present invention to provide a method of extending the stability and enhance the useful lifetime of an OLED device.

This object is achieved by a method of treating a cathode of an OLED device having a substrate and which has a spaced anode and organic layers between the anode and cathode, comprising:

a) evacuating a chamber so that it has a pressure no greater than $10^{-6}$ Torr;

b) heating the OLED substrate in the chamber to a temperature less than 100° C.; and c) delivering gas, including ozone, to the evacuated chamber which includes the heated OLED substrate at a sufficient rate so that the pressure is less than 1 atmosphere, so that the life of the OLED substrate is increased and the operating voltage is decreased.

Advantages

It is an advantage of the present invention that it increases the useful operational lifetime of an OLED device and permits the OLED device to operate effectively at a lower applied voltage. It is a further advantage that it permits the formation of OLED devices with thinner organic layers without the degradation that such thinner layers often undergo. It is a further advantage of this invention that it can be readily integrated into a manufacturing process utilizing an atomic layer deposition (ALD) encapsulation process.

Since device feature dimensions such as layer thickness are frequently in sub-micrometer ranges, the drawings are scaled for ease of visualization rather than dimensional accuracy.

DETAILED DESCRIPTION OF THE INVENTION

The term "pixel" is employed in its art-recognized usage to designate an area of a display panel that can be stimulated to emit light independently of other areas. The term "OLED device" or "organic light-emitting display" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary colors from which all other colors can be generated by appropriate mixing. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel which can be independently addressable to emit a specific color. For example, a blue subpixel is that portion of a pixel which can be addressed to emit blue light. In a full-color display, a pixel generally comprises three primary-color subpixels, namely blue, green, and red.

Figure 1:
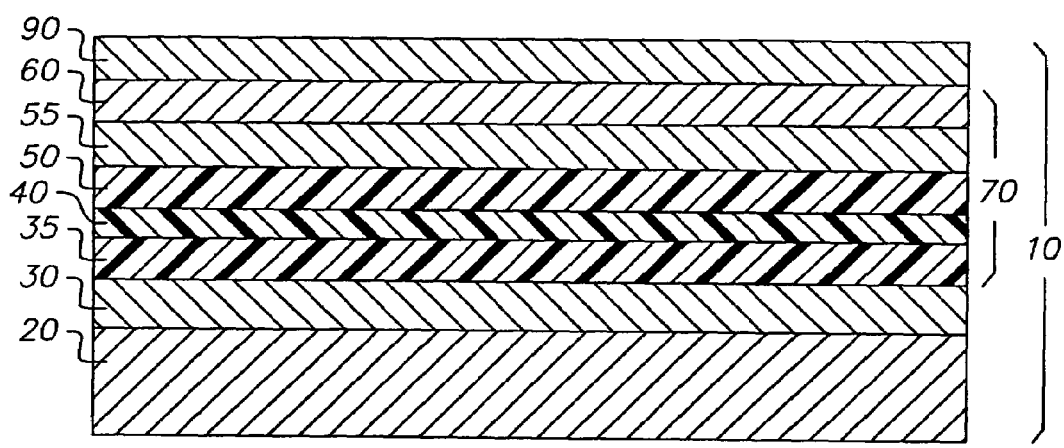
FIG. 1 is a schematic cross-sectional view of an OLED device that can be used in accordance with a first embodiment of the invention.

Turning now to FIG. 1, there is shown a cross-sectional view of a pixel of a light-emitting OLED device 10 that can be used according to a first embodiment of the present invention. The OLED device 10 includes at a minimum a substrate 20, a cathode 90, an anode 30 spaced from cathode 90, and a light-emitting layer 50. The OLED device can also include a hole-injecting layer 35, a hole-transporting layer 40, an electron-transporting layer 55, and an electron-injecting layer 60. Hole-injecting layer 35, hole-transporting layer 40, light-emitting layer 50, electron-transporting layer 55, and electron-injecting layer 60 comprise a series of organic layers 70 disposed between anode 30 and cathode 90. These components will be described in more detail.

Substrate 20 can be an organic solid, an inorganic solid, or include organic and inorganic solids. Substrate 20 can be rigid or flexible and can be processed as separate individual pieces, such as sheets or wafers, or as a continuous roll.

Typical substrate materials include glass, plastic, metal, ceramic, semiconductor, metal oxide, semiconductor oxide, semiconductor nitride, or combinations thereof. Substrate 20 can be a homogeneous mixture of materials, a composite of materials, or multiple layers of materials. Substrate 20 can be an OLED substrate, that is a substrate commonly used for preparing OLED devices, e.g. active matrix low-temperature polysilicon or amorphous-silicon TFT substrate. The substrate 20 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, ceramics, and circuit board materials, or any others commonly used in the formation of OLED devices, which can be either passive matrix devices or active matrix devices.

An electrode is formed over substrate 20 and is most commonly configured as an anode 30. When EL emission is viewed through the substrate 20, anode 30 should be transparent or substantially transparent to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable way such as evaporation, sputtering, chemical vapor deposition, or electrochemical means. Anode materials can be patterned using well known photolithographic processes.

While not always necessary, it is often useful that a hole-injecting layer 35 be formed over anode 30 in an organic light-emitting display. The hole-injecting material can serve to improve the film formation property of subsequent organic layers and to facilitate injection of holes into the hole-transporting layer. Suitable materials for use in hole-injecting layer 35 include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide (VOx), molybdenum oxide (MoOx), nickel oxide (NiOx), etc. Alternative hole-injecting materials reportedly useful in organic EL devices are described in EP 0 891 121 A1 and EP 1 029 909 A1.

While not always necessary, it is often useful that a hole-transporting layer 40 be formed and disposed over anode 30. Desired hole-transporting materials can be deposited by any suitable way such as evaporation, sputtering, chemical vapor deposition, electrochemical means, thermal transfer, or laser thermal transfer from a donor material. Hole-transporting materials useful in hole-transporting layer 40 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520. A more preferred class of aromatic tertiary amines are those which include at least two aromatic tertiary amine moieties as described in U.S. Pat. Nos. 4,720,432 and 5,061,569.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-emitting layer 50 produces light in response to hole-electron recombination. Light-emitting layer 50 is commonly disposed over hole-transporting layer 40. Desired organic light-emitting materials can be deposited by any suitable way such as evaporation, sputtering, chemical vapor deposition, electrochemical means, or radiation thermal transfer from a donor material. Useful organic light-emitting materials are well known. As more fully described in U.S. Pat. Nos. 4,769,292 and 5,935,721, the light-emitting layers of the organic EL element comprise a luminescent or fluorescent material where electroluminescence is produced as a result of electron-hole pair recombination in this region. The light-emitting layers can be comprised of a single material, but more commonly include a host material doped with a guest compound or dopant where light emission comes primarily from the dopant. The dopant is selected to produce color light having a particular spectrum. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host material to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red

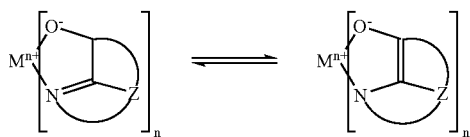

wherein:

M represents a metal;

n is an integer of from 1 to 3; and

Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)];

CO-2: Magnesium bisoxine [alias, bis(8-quinolinolato)magnesium(II)];

CO-3: Bis[benzo{f}-8-quinolinolato]zinc (II);

CO-4: Bis(2-methyl-8-quinolinolato)aluminum(III)-μ-oxo-bis(2-methyl-8-quinolinolato) aluminum(III);

CO-5: Indium trisoxine [alias, tris(8-quinolinolato)indium];

CO-6: Aluminum tris(5-methyloxine) [alias, tris(5-methyl-8-quinolinolato) aluminum(III)];

CO-7: Lithium oxine [alias, (8-quinolinolato)lithium(I)];

CO-8: Gallium oxine [alias, tris(8-quinolinolato)gallium (III)]; and

CO-9: Zirconium oxine [alias, tetra(8-quinolinolato)zirconium(IV)].

The host material in light-emitting layer 50 can be an anthracene derivative having hydrocarbon or substituted hydrocarbon substituents at the 9 and 10 positions. For example, derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red

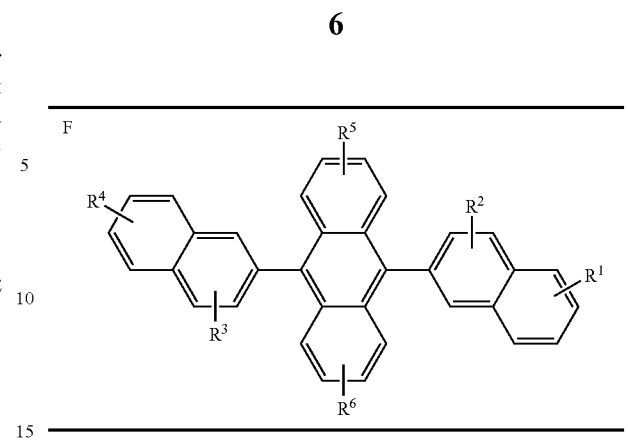

wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Benzazole derivatives (Formula G) constitute another class of useful host materials capable of supporting electroluminescence, and are particularly suitable for light emission of wavelengths longer than 400 nm, e.g., blue, green, yellow, orange or red

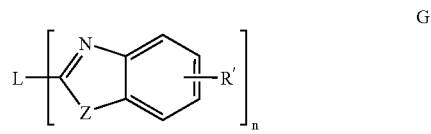

where:

n is an integer of 3 to 8;

Z is O, NR or S;

R' is hydrogen; alkyl of from 1 to 24 carbon atoms, for example, propyl, t-butyl, heptyl, and the like; aryl or heteroatom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit including alkyl, aryl, substituted alkyl, or substituted aryl, which conjugately or unconjugately connects the multiple benzazoles together.

An example of a useful benzazole is 2, 2', 2''-(1,3,5-phenylene)tris[1-phenyl-1H-benzimidazole].

Desirable fluorescent dopants include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrilium and thiapyrilium compounds, derivatives of distryrylbenzene or distyrylbiphenyl, bis(azinyl)methane boron complex compounds, and carbostyryl compounds.

Other organic emissive materials can be polymeric substances, e.g. polyphenylenevinylene derivatives, dialkoxypolyphenylenevinylenes, poly-para-phenylene derivatives, and polyfluorene derivatives, as taught by Wolk et al. in commonly assigned U.S. Pat. No. 6,194,119 B1 and references cited therein.

While not always necessary, it is often useful that OLED device 10 includes an electron-transporting layer 55 disposed over light-emitting layer 50. Desired electron-transporting materials can be deposited by any suitable way such as evaporation, sputtering, chemical vapor deposition, electrochemical means, thermal transfer, or laser thermal transfer from a donor material. Preferred electron-transporting materials for use in electron-transporting layer 55 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

It will be understood that, as is common in the art, some of the layers can have more than one function. Light-emitting layer 50 can have hole-transporting properties or electron-transporting properties as desired for performance of the OLED device. Hole-transporting layer 40 or electron-transporting layer 55, or both, can also have emitting properties. In such a case, fewer layers than described above can be sufficient for the desired emissive properties. Alternatively, some of the above layers can be more than one physical layer to provide the desired emission properties. For example, light-emitting layer 50 can comprise two or more light-emitting layers to fulfill desired emission properties, such as emission of white light.

The organic EL media materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g. as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet.

An electron-injecting layer 60 can also be present between the cathode and the electron-transporting layer. Examples of electron-injecting materials include alkaline or alkaline earth metals, alkali halide salts, such as LiF mentioned above, or alkaline or alkaline earth metal doped organic layers.

Cathode 90 is formed over the electron-transporting layer 55 or over light-emitting layer 50 if an electron-transporting layer is not used. When light emission is through the anode 30, the cathode material can be comprised of nearly any conductive material. Desirable materials have good film-forming properties to ensure good contact with the underlying organic layer, promote electron injection at low voltage, and have good stability. Useful cathode materials often contain a low work function metal (<3.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861, 5,059,862, and 6,140,763.

When light emission is viewed through cathode 90, it must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Cathode 90 is spaced, meaning it is vertically spaced apart from anode 30. Cathode 90 can be part of an active matrix device and in that case is a single electrode for the entire display. Alternatively, cathode 90 can be part of a passive matrix device, in which each cathode 90 can activate a column of pixels, and cathodes 90 are arranged orthogonal to anodes 30.

Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Figure 2:
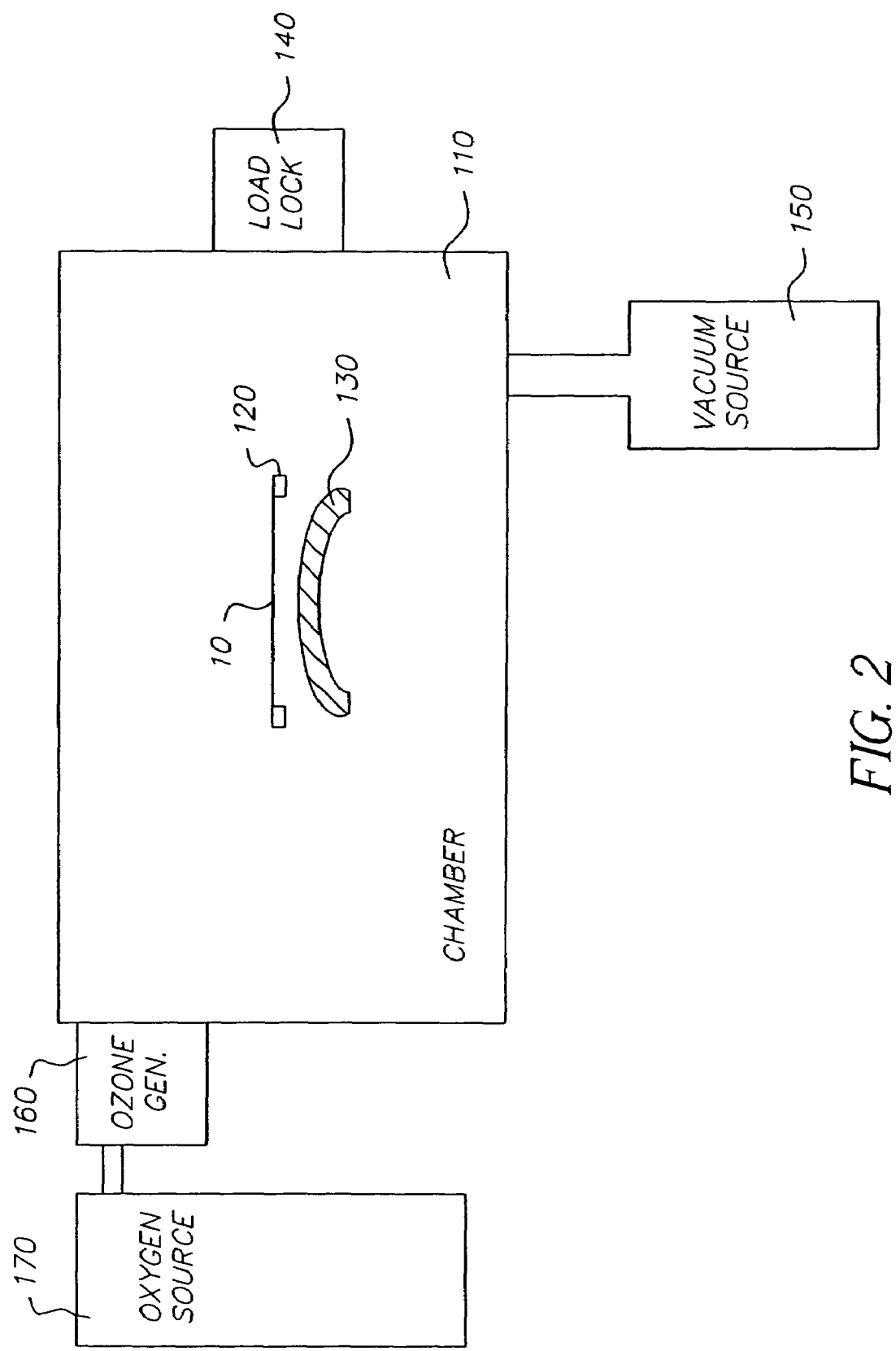
FIG. 2 is a schematic cross-sectional view of a chamber for treating an OLED device in accordance with a first embodiment of the invention.

Turning now to FIG. 2, there is shown a cross-sectional view of a chamber for treating a cathode of an OLED device in accordance with a first embodiment of this invention. OLED device 10 can be placed into chamber 110 by way of load lock 140 and held in place by supports 120. Chamber 110 includes a vacuum source 150, which is capable of evacuating chamber 110 to a pressure of $10^{-6}$ Torr or less. Ozone gas can be delivered to evacuated chamber 110 from oxygen source 170, which can be, e.g. a tank of oxygen that provides oxygen to ozone generator 160. The ozone generator that was used for this purpose was from Ozone Services Inc., model number OL-100. Ozone generator 160 can convert a part of the oxygen from oxygen source 170 into ozone. A useful concentration of ozone is 10–20% by volume, which is delivered at a sufficient rate such that the final pressure within chamber 110 is less than 1 atmosphere OLED device 10, including its substrate 20, is heated by heater 130 to a temperature of less than 100° C. while exposing cathode 90 to the delivered ozone gas in chamber 110. The substrate temperature is below the glass transition temperature of at least one of the deposited organic materials on the OLED device. Such a process will increase the lifetime and decrease the operating voltage of the OLED device.

Figure 3:
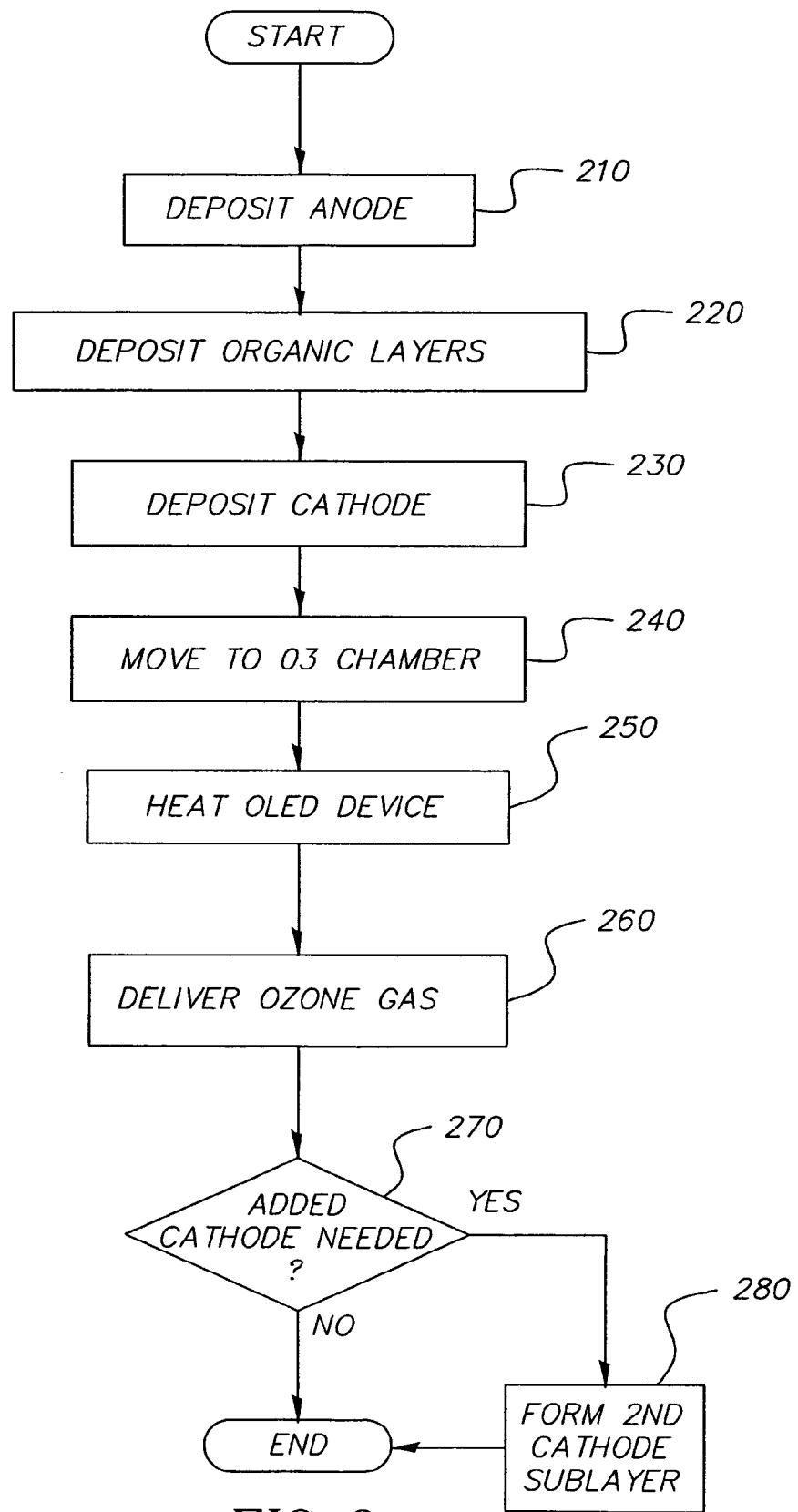
FIG. 3 is a block diagram of a method in accordance with the invention for treating an OLED device.

Turning now to FIG. 3, there is shown a block diagram of a method for forming an OLED device and treating a cathode or a first cathode sublayer of an OLED device in accordance with a first embodiment of this invention. At the start, an anode 30 is deposited onto substrate 20 (Step 210). Then, various organic layers, which can include hole-transporting layer 40, light-emitting layer 50, electron-transporting layer 55, and any other organic layers for proper performance of the desired OLED device, are deposited (Step 220). Then a cathode layer is deposited over the organic layers (Step 230). Preferably, the cathode layer deposited in Step 230 has a thickness of 100 nm or less. In embodiments wherein the desired cathode thickness is greater, cathode 90 can be provided having two or more sublayers. A first cathode sublayer is formed on OLED device 10 to a thickness desired for treatment with ozone gas. Steps 210 through 230 are well known in the manufacture of OLED devices.

The OLED device is then placed in a chamber 110, which is evacuated by vacuum source 150 (Step 240) to a pressure no greater than $10^{-6}$ Torr. The OLED device 10 is moved to an $O_3$ chamber and then heated by heater 130 (step 250) to a temperature less than 100° C. Ozone gas is then delivered to chamber 110 (step 260) by way of oxygen source 170 and ozone generator 160. The percentage of ozone gas is 10–20% by volume of the delivered gas is provided up to a pressure of 1 atmosphere or less over the period of 30 minutes or less. The cathode 90 or first cathode sublayer is treated with the delivered ozone gas as described herein.

After treatment with ozone, the OLED device can be removed from chamber 110 via load lock 140 and encapsulated in the usual manner. If a sufficient thickness of cathode has been deposited (Step 270), the process ends. If additional cathode material is needed for proper functioning of the OLED device, a second cathode sublayer can be formed by any method useful for cathode deposition (Step 280).

Figure 4:
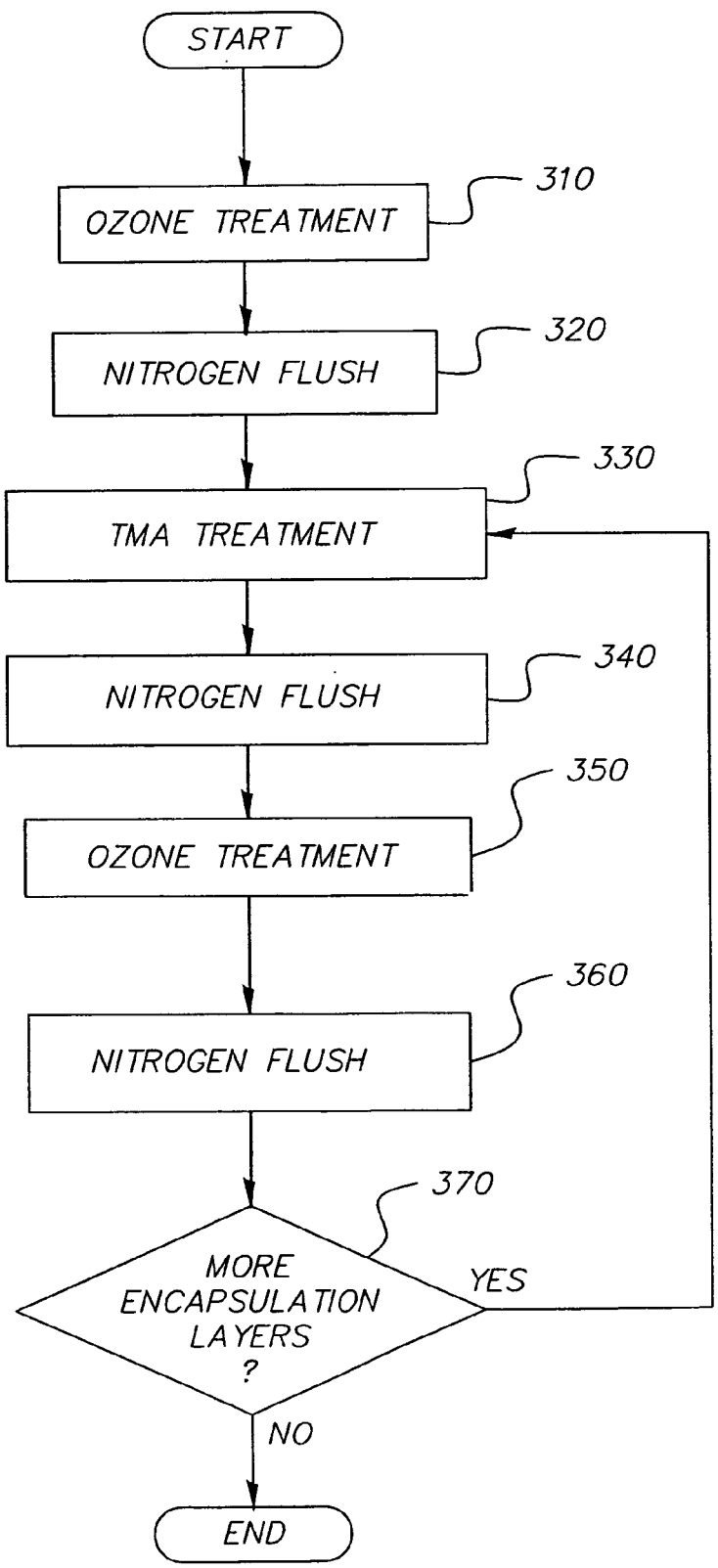
FIG. 4 is a block diagram of a method in accordance with the invention using an atomic layer deposition process.

Turning now to FIG. 4, there is shown a block diagram of a method that illustrates the ease with which the method described herein can be integrated into an atomic layer deposition (ALD) process. All OLED devices require a hermetic encapsulation to ensure no moisture or oxygen enters into the device area, which is typically detrimental to the device operation and life. In many applications of OLED devices a thin film encapsulation is often desired such as a top emitter device architecture. This is because the more conventional encapsulation method based on desiccant and epoxy is inadequate. Atomic layer deposition (ALD) provides an excellent method of providing a highly conformal inorganic coating that forms the primary encapsulation layer, thereby, providing a barrier for moisture and oxygen. This method of encapsulation is described in a prior art (WO01 82390 A1). In such an ALD process, an OLED device is repeatedly subjected alternately to treatment with an oxidizable gas (e.g. trimethylaluminum, or TMA) and treatment with an oxidizing gas (e.g. ozone) to form an encapsulating transparent oxide. At the start of the ALD process incorporating this invention, the OLED device 10 is subjected to ozone treatment (Step 310) in a chamber 110, as has already been described. This can be followed by a flush with an inert gas, e.g. nitrogen (Step 320). OLED device 10 is then exposed to trimethylaluminum, which forms a monolayer on the surface of cathode 90, followed by a flush with inert gas, e.g. nitrogen (Step 340), to remove unreacted trimethylaluminum. OLED 10 is then exposed to the oxidizing gas, e.g. ozone (Step 350), followed by a flush with inert gas (Step 360). The result is a thin layer of a metal oxide, e.g. aluminum oxide, that encapsulates OLED device 10. If additional layers of encapsulating metal oxide are to be added (Step 370), Steps 330 to 360, which are the prior art atomic layer deposition encapsulation technique, are repeated as necessary. If a sufficient thickness of metal oxide encapsulates OLED device 10, the process ends. Because the ALD process incorporates an oxidizing step, such as ozone treatment, an additional ozone treatment of OLED device 10 before encapsulation can be readily incorporated as the first step of this process (e.g. Step 310).

The invention and its advantages can be better appreciated by the following comparative examples:

EXAMPLE 1

Comparative Example

A prior art OLED device was constructed in the following manner:
1. A clean glass substrate was vacuum-deposited with indium tin oxide (ITO) through a mask to form a pattern of transparent electrodes of 40 to 80 nm thickness;
2. The above-prepared ITO surface was treated with a plasma oxygen etch, followed by plasma deposition of a 0.1 nm layer of a fluorocarbon polymer ($CF_x$) as described in U.S. Pat. No. 6,208,075;
3. The above-prepared substrate was further treated by vacuum-depositing a 150 nm layer of 4,4'-bis[N-(1-naphthyl)-N-phenylamino]biphenyl (NPB) as a hole-transporting layer at a rate of 4A/sec;
4. A 75 nm electron-transporting layer of tris(8-quinolinolato)aluminum (III) (ALQ) was vacuum-deposited at a rate of 2 A/sec; and
5. A cathode layer was deposited onto the Alq layer using vacuum deposition. The cathode layer included two different layers, namely, 0.5 nm of LiF followed by 100 nm of aluminum.

EXAMPLE 2

Inventive Example

An OLED device satisfying the requirements of the invention was constructed in the manner described in Example 1, except that after construction, it was treated as described herein with 10% ozone gas at a pressure of 200 Torr for one hour at room temperature.

EXAMPLE 3

Inventive Example

An OLED device satisfying the requirements of the invention was constructed in the manner described in Example 1, except that after construction, it was treated as described herein with 10% ozone gas at a pressure of 200 Torr for one hour at 90° C.

The devices were tested for various electrical and optical properties immediately after fabrication as well as during operation. The voltage and luminous efficiency are some of the examples of various test done at various current densities. The typical operating condition is done at constant current density of 20 mA/cm$^2$. The accelerated operational test is done at 80 mA/cm$^2$. Since it is time consuming to obtain meaningful data at a current density of 20 mA/cm$^2$, accelerated testing at 80 mA/cm$^2$ was used for testing purposes.

The following table shows the results.

|  | Untreated | Heat treated only | Ozone treated only | Heat + Ozone treated |
|---|---|---|---|---|
| Initial Voltage (volts) | 10.65 | 10.60 | 10.25 | 10.10 |
| Voltage at 100 hrs (volts) | 12.00 | 12.00 | 11.60 | 11.38 |
| Percentage increase in lifetime (decrease in luminance to 50% of initial value) | — | 50% | 40% | 75% |

It can be seen from the above table that the device lifetime, measured in hours as a decrease in the luminance to 50% of the initial luminance, is increased by 40% for ozone only treated devices, 50% for heat only treated devices, and 75% for heat and ozone treated samples.

Additionally, it can be seen that the ozone treated devices exhibit lower operating voltages than the untreated ones. The ozone+heat treated device is even more effective at reducing the necessary operating voltage and increasing the useful life of the OLED device. However, the heat only treated device did not show any significant change in either the initial voltage or the operating voltage at 100 hours. As such, the preferred embodiment of this invention is to heat the device substrate as well as ozone treat it, while it is hot, in order to obtain the maximum improvement.

It is believed that pinholes in the organic layers are filled or partially filled with cathode material during the cathode deposition step, leading to potential microshorts in the device. Such microshorts are more likely in thinner organic layers. They lead to the need for greater voltage to achieve a given desired luminance of the device, and can eventually degrade the device. It is believed that ozone treatment can oxidize the cathode material in such pinholes, reducing the likelihood of microshorts, lowering the required voltage for a given luminance, and extending the life of the OLED device.

Although the invention is described here for undoped devices it is obvious to apply these treatments to doped devices as well in order to obtain lifetime improvements. The invention has been described in detail with particular reference to certain preferred embodiments thereof, but it will be understood that variations and modifications can be effected within the spirit and scope of the invention.

| PARTS LIST | |
|---|---|
| 10 | OLED device |
| 20 | substrate |
| 30 | anode |
| 35 | hole-injecting layer |
| 40 | hole-transporting layer |
| 50 | light-emitting layer |
| 55 | electron-transporting layer |
| 60 | electron-injecting layer |
| 70 | organic layers |
| 90 | cathode |
| 110 | chamber |
| 120 | support |
| 130 | heater |
| 140 | load lock |
| 150 | vacuum source |
| 160 | ozone generator |
| 170 | oxygen source |
| 210 | block |
| 220 | block |
| 230 | block |
| 240 | block |
| 250 | block |
| 260 | block |
| 270 | decision block |
| 280 | block |
| 310 | block |
| 320 | block |
| 330 | block |
| 340 | block |
| 350 | block |
| 360 | block |
| 370 | decision block |

The invention claimed is:

1. A method of treating a cathode of an OLED device having a substrate and which has a spaced anode and organic layers between the anode and cathode, comprising:
    a) evacuating a chamber so that it has a pressure no greater than 10$^{-6}$ Torr;
    b) heating the OLED substrate in the chamber to a temperature less than 100° C.; and
    c) delivering gas, including ozone, to the evacuated chamber which includes the heated OLED substrate to increase the pressure in the chamber to a level that is less than 1 atmosphere, so that the life of the OLED substrate is increased and the operating voltage is decreased.

2. A method of forming an OLED device, comprising:
    a) providing an anode over the substrate;
    b) providing a series of organic layers over the substrate; and
    c) providing a cathode having at least two sublayers by forming a first cathode sublayer on the organic layers and treating the first cathode sublayer in accordance with the method according to claim 1, and forming a second cathode sublayer on the first cathode sublayer.

3. The method according to claim 1 wherein the ozone gas concentration is between the range of 10–20% by volume of the incoming gas and the substrate temperature is below the glass transition temperature of at least one of the deposited organic materials on the OLED device.

4. The method according to claim 2 wherein the ozone gas concentration is between the range of 10–20% by volume of the incoming gas and the substrate temperature is below the glass transition temperature of at least one of the deposited organic materials on the OLED device.

5. A method of forming an OLED device, comprising:
    a) providing a substrate and an anode over the substrate;
    b) providing a series of organic layers over the substrate;
    c) providing a cathode over the substrate;
    d) performing the method according to claim 1; and
    e) forming by an atomic layer deposition process an encapsulation layer using alternating gases, at least one of which has ozone.

* * * * *